(12) United States Patent
Miller et al.

(10) Patent No.: US 9,212,421 B2
(45) Date of Patent: Dec. 15, 2015

(54) METHOD AND APPARATUS TO REDUCE CONTAMINATION OF PARTICLES IN A FLUIDIZED BED REACTOR

(71) Applicant: REC Silicon Inc, Moses Lake, WA (US)

(72) Inventors: Matthew J. Miller, Moses Lake, WA (US); Michael V. Spangler, Soap Lake, WA (US)

(73) Assignee: REC Silicon Inc, Moses Lake, WA (US)

( * ) Notice: Subject to any disclaimer, the term of this patent is extended or adjusted under 35 U.S.C. 154(b) by 24 days.

(21) Appl. No.: 13/939,067

(22) Filed: Jul. 10, 2013

(65) Prior Publication Data

US 2015/0017787 A1    Jan. 15, 2015

(51) Int. Cl.
*C23C 16/442*    (2006.01)
*C23C 16/06*    (2006.01)
*C23C 16/44*    (2006.01)
*C22C 19/00*    (2006.01)
*B01J 8/18*    (2006.01)

(52) U.S. Cl.
CPC .............. *C23C 16/442* (2013.01); *B01J 8/1836* (2013.01); *C22C 19/00* (2013.01); *C23C 16/06* (2013.01); *C23C 16/4404* (2013.01); *B01J 2208/00407* (2013.01); *B01J 2219/0231* (2013.01); *B01J 2219/0236* (2013.01)

(58) Field of Classification Search
CPC ................. C23C 16/4404; C22C 19/00; B01J 2208/00407; B01J 8/1836; B01J 2219/0236
USPC .......................................................... 438/488
See application file for complete search history.

(56) References Cited

U.S. PATENT DOCUMENTS

| | | |
|---|---|---|
| 3,012,861 A | 12/1961 | Ling |
| 3,012,862 A | 12/1961 | Bertrand et al. |
| 4,314,525 A | 2/1982 | Hsu et al. |
| 4,416,913 A | 11/1983 | Ingle et al. |
| 4,820,587 A | 4/1989 | Gautreaux et al. |
| 4,868,013 A | 9/1989 | Allen |
| 4,883,687 A | 11/1989 | Gautreaux et al. |
| 5,077,028 A | 12/1991 | Age |
| 5,139,762 A | 8/1992 | Flagella |
| 5,798,137 A | 8/1998 | Lord et al. |
| 5,810,934 A | 9/1998 | Lord et al. |
| 7,029,632 B1 | 4/2006 | Weidhaus et al. |
| 8,075,692 B2 | 12/2011 | Osborne et al. |
| 8,168,123 B2 | 5/2012 | Sanchez et al. |
| 2002/0081250 A1 | 6/2002 | Lord |

(Continued)

FOREIGN PATENT DOCUMENTS

JP     2010-500274 A     4/2009

OTHER PUBLICATIONS

International Search Report and Written Opinion, dated Feb. 12, 2014, issued in corresponding International Application No. PCT/US2013/068487.

(Continued)

*Primary Examiner* — William F Kraig
*Assistant Examiner* — Nga Doan
(74) *Attorney, Agent, or Firm* — Klarquist Sparkman, LLP

(57) ABSTRACT

A method and fluidized bed reactor for reducing or eliminating contamination of silicon-coated particles are disclosed. The metal surface of one or more fluidized bed reactor components is at least partially coated with a hard protective layer comprising a material having an ultimate tensile strength of at least 700 MPa at 650° C.

18 Claims, 2 Drawing Sheets

(56) References Cited

U.S. PATENT DOCUMENTS

| | | |
|---|---|---|
| 2002/0086530 A1 | 7/2002 | Kim et al. |
| 2002/0102850 A1 | 8/2002 | Kim et al. |
| 2004/0047794 A1* | 3/2004 | Pfaffelhuber et al. ........ 423/342 |
| 2008/0056979 A1 | 3/2008 | Arvidson et al. |
| 2008/0159942 A1 | 7/2008 | Berthold et al. |
| 2008/0220166 A1 | 9/2008 | Ege et al. |
| 2008/0241046 A1 | 10/2008 | Hertlein et al. |
| 2008/0299291 A1* | 12/2008 | Weidhaus et al. ................. 427/8 |
| 2009/0004090 A1 | 1/2009 | Kim et al. |
| 2009/0047204 A1 | 2/2009 | Kim et al. |
| 2009/0324479 A1 | 12/2009 | Kulkarni et al. |
| 2010/0044342 A1 | 2/2010 | Kim et al. |
| 2010/0047136 A1 | 2/2010 | Kim et al. |
| 2010/0068116 A1 | 3/2010 | Kim et al. |
| 2010/0215562 A1 | 8/2010 | Sanchez et al. |
| 2010/0273010 A1* | 10/2010 | Froehlich et al. ............. 428/428 |
| 2011/0117729 A1* | 5/2011 | Osborne et al. ............... 438/478 |
| 2011/0300016 A1 | 12/2011 | Heath |
| 2012/0063984 A1* | 3/2012 | Fieselmann et al. .......... 423/349 |

OTHER PUBLICATIONS

Sidhu, et al., Erosion-Corrosion of Plasma as Sprayed and Laser Remelted Stellite-6 Coatings in a Coal Fired Boiler, *Wear*, vol. 260, pp. 1035-1044 (2006).

Priyantha, et al., Corrosion-Resistant Metallic Coatings for Applications in Highly Aggressive Environments, *Surface and Coatings Technology*, vol. 163-164, pp. 31-36 (2003).

\* cited by examiner

METHOD AND APPARATUS TO REDUCE CONTAMINATION OF PARTICLES IN A FLUIDIZED BED REACTOR

FIELD

The present disclosure relates to hard protective layers for use with a fluidized bed reactor, particularly a fluidized bed reactor for pyrolytic decomposition of a silicon-bearing gas to produce silicon-coated particles.

BACKGROUND

Pyrolytic decomposition of silicon-bearing gas in fluidized beds is an attractive process for producing polysilicon for the photovoltaic and semiconductor industries due to excellent mass and heat transfer, increased surface for deposition, and continuous production. Compared with a Siemens-type reactor, the fluidized bed reactor offers considerably higher production rates at a fraction of the energy consumption. The fluidized bed reactor can be highly automated to significantly decrease labor costs.

The manufacture of particulate polycrystalline silicon by a chemical vapor deposition method involving pyrolysis of a silicon-containing substance such as for example silane, disilane or halosilanes such as trichlorosilane or tetrachlorosilane in a fluidized bed reactor is well known to a person skilled in the art and exemplified by many publications including the following patents and publications: U.S. Pat. No. 8,075,692, U.S. Pat. No. 7,029,632, U.S. Pat. No. 5,810,934, U.S. Pat. No. 5,798,137, U.S. Pat. No. 5,139,762, U.S. Pat. No. 5,077,028, U.S. Pat. No. 4,883,687, U.S. Pat. No. 4,868,013, U.S. Pat. No. 4,820,587, U.S. Pat. No. 4,416,913, U.S. Pat. No. 4,314,525, U.S. Pat. No. 3,012,862, U.S. Pat. No. 3,012,861, US2010/0215562, US2010/0068116, US2010/0047136, US2010/0044342, US2009/0324479, US2008/0299291, US2009/0004090, US2008/0241046, US2008/0056979, US2008/0220166, US 2008/0159942, US2002/0102850, US2002/0086530, and US2002/0081250.

Silicon is deposited on particles in a reactor by decomposition of a silicon-bearing gas selected from the group consisting of silane ($SiH_4$), disilane ($Si_2H_6$), higher order silanes ($Si_nH_{2n+2}$), dichlorosilane ($SiH_2Cl_2$), trichlorosilane (SiHCl$_3$), silicon tetrachloride ($SiCl_4$), dibromosilane ($SiH_2Br_2$), tribromosilane ($SiHBr_3$), silicon tetrabromide ($SiBr_4$), diiodosilane ($SiH_2I_2$), triiodosilane ($SiHI_3$), silicon tetraiodide ($SiI_4$), and mixtures thereof. The silicon-bearing gas may be mixed with one or more halogen-containing gases, defined as any of the group consisting of chlorine ($Cl_2$), hydrogen chloride (HCl), bromine ($Br_2$), hydrogen bromide (HBr), iodine ($I_2$), hydrogen iodide (HI), and mixtures thereof. The silicon-bearing gas may also be mixed with one or more other gases, such as hydrogen ($H_2$) and/or one or more inert gases selected from nitrogen ($N_2$), helium (He), argon (Ar), and neon (Ne). In particular embodiments, the silicon-bearing gas is silane, and the silane is mixed with hydrogen. The silicon-bearing gas, along with any accompanying hydrogen, halogen-containing gases and/or inert gases, is introduced into a fluidized bed reactor and thermally decomposed within the reactor to produce silicon which deposits upon seed particles inside the reactor.

A common problem in fluidized bed reactors is contamination of silicon-coated particles in the fluid bed at high operating temperatures by materials used to construct the reactor and its components. For example, nickel has been shown to diffuse into a silicon layer (e.g., on a silicon-coated particle) from the base metal in some nickel alloys used to construct reactor parts. Similar problems arise in fluidized bed reactors configured for pyrolytic decomposition of a germanium-bearing gas to produce germanium-coated particles.

SUMMARY

This disclosure concerns reducing or eliminating contamination of silicon-coated particles due to contact with a metal surface in a fluidized bed reactor. Reactor components having such a metal surface include, but are not limited to, injection nozzles, fluidization gas inlet tubes, seed inlet tubes, product withdrawal outlet tubes, liners, probe assemblies, sample nozzles, pressure nozzles, thermocouples, internal heaters, and bubble breakers.

At least one fluidized bed reactor component has a surface comprising metal that is at least partially coated with a protective layer comprising a material having an ultimate tensile strength of at least 700 MPa at 650° C. In some embodiments, at least 95% of the surface is coated with the protective layer. The protective layer may have an average thickness of at least 0.1 mm, such as an average thickness from 0.1 mm to 1 mm. The thickness of the protective layer may vary across a width and/or along a length of the surface. In one embodiment, a portion of the fluidized bed reactor component is constructed entirely of a material having substantially the same chemical composition as the protective layer.

The metal and the protective layer each have a thermal coefficient of expansion (TCE). In some embodiments, the TCEs differ from one another by ≤30%. An intermediate coating may be disposed between the metal and the protective layer, wherein the intermediate coating has a TCE between the TCEs of the metal and the protective layer.

Exemplary protective layers include cobalt-based alloys, nickel-based alloys, or a combination thereof. In one embodiment, the protective layer is a cobalt-based alloy comprising 25-35% Cr, ≤10% W, ≤10% Ni, ≤5% Mo, ≤3% Fe, ≤2% Si, ≤2% C, ≤1.5% Mn, ≤1% B, ≤0.05% P, ≤0.05% S and 30.5-75% cobalt. In another embodiment, the protective layer is a nickel-based superalloy comprising 4-30% Mo, 5-25% Cr, 2-15% Co, ≤3.5% Ti, ≤2% Fe, ≤2% Al, ≤1% Mn, ≤1% Si, ≤0.5% Cu, ≤0.1% C, ≤0.1% Zr, ≤0.01% B, and 23.4-89% nickel.

A fluidized bed reactor unit for production of polycrystalline silicon includes a reactor defining a reactor chamber, and one or more reactor components having a surface facing the reactor chamber, the surface comprising metal that is at least partially coated with a protective layer as disclosed herein.

Embodiments of a process for the production of granulate polycrystalline silicon particles include flowing a silicon-containing gas through a fluidized bed reactor containing a seed particle within a reactor chamber defined by the fluidized bed reactor to effect pyrolysis of the silicon-containing gas and deposition of a polycrystalline silicon layer on the seed particle to form a polycrystalline silicon-coated particle, wherein the fluidized bed reactor comprises one or more reactor components having a surface facing the reactor chamber, the surface comprising metal that is at least partially coated with a protective layer as disclosed herein. The protective layer reduces or eliminates contact of the polycrystalline silicon-coated particle with the metal, and reduces or eliminates metal contamination of the polycrystalline silicon particle.

The features and advantages of the invention will become more apparent from the following detailed description, which proceeds with reference to the accompanying figures.

DETAILED DESCRIPTION

Embodiments of a method and fluidized bed reactor for reducing or eliminating contamination of silicon-coated particles are disclosed. The metal surface of one or more fluidized bed reactor components is at least partially coated with a hard protective layer. As used herein, the term "reactor component" refers to any component of a fluidized bed reactor having a surface (e.g., a surface comprising metal) that may contact silicon-coated particles during reactor operation.

As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all percentages referring to a composition are understood to be a percent by weight, i.e., % (w/w). For example, a composition comprising 20% cobalt includes 20 g cobalt per 100 g of the composition.

Figure 1:
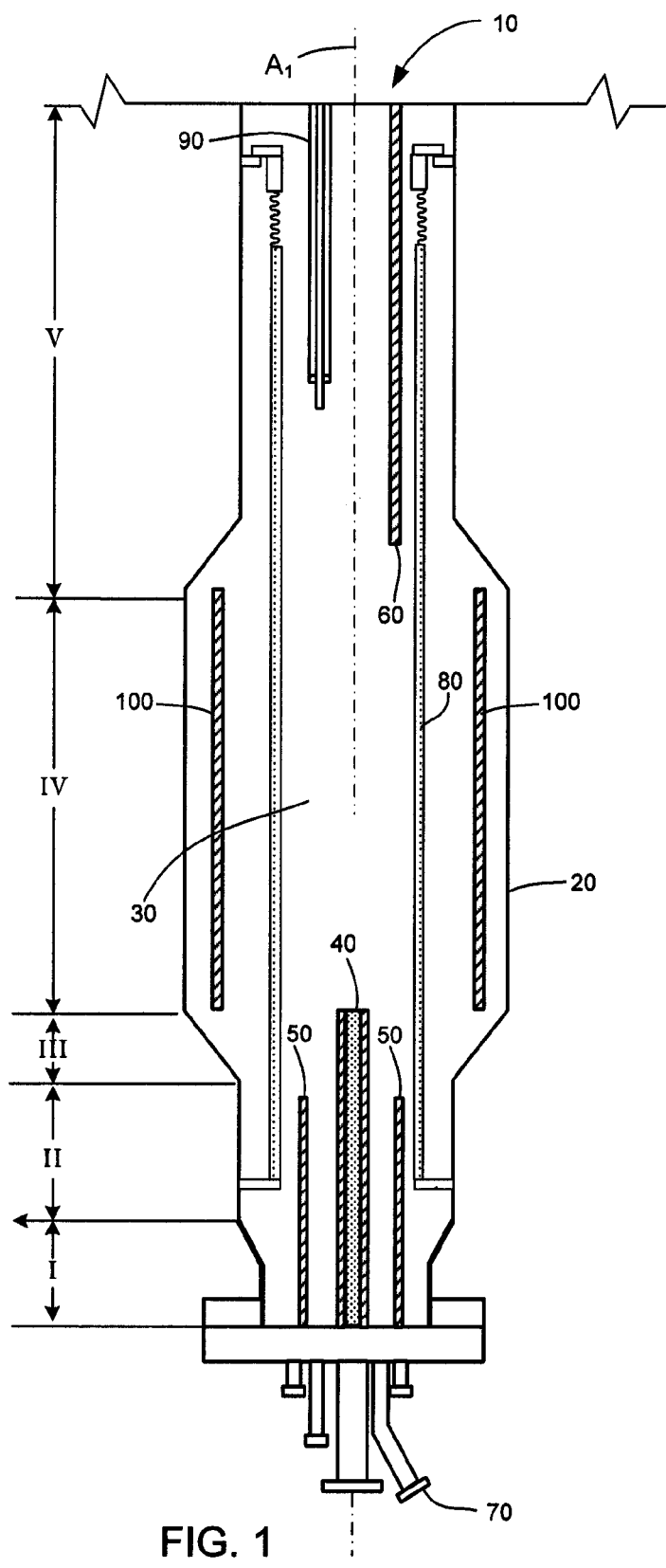
FIG. 1 is a schematic cross-sectional elevational view of a fluidized bed reactor.

FIG. 1 is a simplified schematic diagram of a fluidized bed reactor 10 for producing silicon-coated particles. The reactor 10 extends generally vertically, has an outer wall 20, a central axis $A_1$, and may have cross-sectional dimensions that are different at different elevations. The reactor shown in FIG. 1 has five regions, I-V, of differing cross-sectional dimensions at various elevations. The reaction chamber may be defined by walls of different cross-sectional dimensions, which may cause the upward flow of gas through the reactor to be at different velocities at different elevations.

Silicon-coated particles are grown by pyrolytic decomposition of a silicon-bearing gas within a reactor chamber 30 and deposition of silicon onto particles within a fluidized bed. One or more inlet tubes 40 are provided to admit a primary gas, e.g., a silicon-bearing gas or a mixture of silicon-bearing gas, hydrogen and/or an inert gas (e.g., helium, argon) into the reactor chamber 30. The reactor 10 further includes one or more fluidization gas inlet tubes 50. Additional hydrogen and/or inert gas can be delivered into the reactor through fluidization inlet tube(s) 50 to provide sufficient gas flow to fluidize the particles within the reactor bed. At the outset of production and during normal operations, seed particles are introduced into reactor 10 through a seed inlet tube 60. Silicon-coated particles are harvested by removal from reactor 10 through one or more product outlet tubes 70. A liner 80 may extend vertically through the reactor 10. In some arrangements, the liner is concentric with the reactor wall 20. The illustrated liner 80 is generally a circular cylinder in shape. In some embodiments, a probe assembly 90 extends into the reactor chamber 30. The reactor 10 further includes one or more heaters. In some embodiments, the reactor includes a circular array of heaters 100 located concentrically around reactor chamber 30 between liner 80 and outer wall 20. In some systems, a plurality of radiant heaters 100 is utilized with the heaters 100 spaced equidistant from one another.

The temperature in the reactor differs in various portions of the reactor. For example, when operating with silane as the silicon-containing compound from which silicon is to be released in the manufacture of polysilicon particles, the temperature in region I, i.e., the bottom zone, is ambient temperature to 100° C. (FIG. 1). In region II, i.e., the cooling zone, the temperature typically ranges from 50-700° C. In region III, the intermediate zone, the temperature is substantially the same as in region IV. The central portion of region IV, i.e., the reaction and splash zone, is maintained at 620-760° C., and advantageously at 660-690° C., with the temperature increasing to 700-900° C. near the walls of region IV, i.e., the radiant zone. The upper portion of region V, i.e., the quench zone, has a temperature of 400-450° C.

Surfaces in contact with silicon-coated particles in reactor chamber 30 can be a source of product contamination. Soft metals, for example, are prone to galling from contact with fluidized silicon particles. The term "galling" refers to wear and transfer of material between metallic surfaces that are in direct contact with relative movement. Silicon particles can be contaminated by the transferred metal. Galling also causes wear and tear of metal components, leading to reactor downtime as components are replaced or the metal surfaces are ground or machined to return them to condition for reuse. Thus, there is a need for improved reactor surfaces that will better withstand reactor conditions, reduce product contamination, or both.

Embodiments of protective layers suitable for withstanding reactor conditions and/or reducing product contamination are disclosed. The disclosed protective layers can be applied to one or more reactor components having a metal surface that would be exposed to silicon-coated particles during reactor operation, i.e., having a metal surface facing silicon-coated particles during reactor operation. Reactor components that may receive a protective layer include, but are not limited to, an injection nozzle or inlet tube 40, a fluidization gas inlet tube 50, a seed inlet tube 60, a product withdrawal outlet tube 70, a liner 80, a probe assembly 90, a sample nozzle (not shown), a pressure nozzle (not shown), a thermocouple (not shown), an internal heater (not shown), and a bubble breaker (not shown). At least a portion of the exposed metal surface of the reactor component is coated with an embodiment of the disclosed protective layers. In some embodiments, the exposed metal surface is completely, or substantially completely, coated with the protective layer. For example, at least 95%, at least 97% or at least 99% of the exposed metal surface may be coated with the protective layer. Thus, a surface that faces into the reactor chamber and/or is exposed to silicon-coated particles during reactor operation comprises metal that is at least partially coated with the protective layer.

Hardness can be difficult to measure at high temperatures, such as the operating temperatures in a fluidized bed reactor. However, there is a positive correlation between hardness and ultimate tensile strength. Thus, ultimate tensile strength can used as a proxy for hardness at high temperatures. In some embodiments, the protective layer has an ultimate tensile strength of at least 700 MPa at 650° C., advantageously an ultimate tensile strength of at least 800 MPa, at least 900 MPa, or at least 1000 MPa at 650° C. Ultimate tensile strength (the maximum engineering stress a material withstands during a tensile test, e.g., the peak value on the materials's stress/strain curve) can be determined using a tensile testing machine (e.g., Instron®, Norwood, Mass.). Suitable methods for testing ultimate tensile strength of metals include ASTM (American Society of Testing and Materials) E8 and ASTM A370.

Because components within a fluid bed reactor undergo large temperature changes, the underlying material has a thermal coefficient of expansion (TCE-1) that is similar to a thermal coefficient of expansion of the protective layer (TCE-2). In some embodiments, TCE-2 and TCE-1 differ by ≤30%, advantageously by ≤20% or ≤10%. When the underlying material is 304H steel (TCE=18.6×10$^{-6}$/K) or 800H steel (TCE=16.9×10$^{-6}$/K), for example, the protective layer may have a TCE from 11.8×10$^{-6}$/K (i.e., TCE-1×0.7) to 24.2×10$^{-6}$/K (i.e., TCE-1÷0.7), advantageously a TCE from 13.5×10$^{-6}$/K to 22.3×10$^{-6}$/K. Generally, a protective layer with sufficient hardness to withstand reactor conditions will have a TCE that is less than or equal to the underlying material's TCE.

Figure 2:
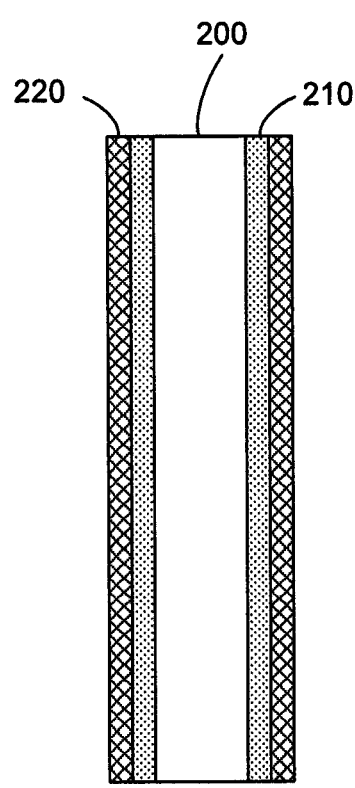
FIG. 2 is a schematic cross-sectional elevational view of an inlet tube coated with an intermediate bonding or adhesion promoter coating and an outer protective layer.

In some embodiments, an intermediate bonding or adhesion promoter coating is applied to the reactor component prior to application of the protective layer. For example, as shown in FIG. 2, an inlet tube 200 may be coated with an intermediate bonding or adhesion promoter coating 210 and an outer protective layer 220. Advantageously, the intermediate coating has a thermal coefficient of expansion (TCE-3) that is between TCE-1 and TCE-2. The intermediate coating may increase durability of the protective layer by reducing or preventing delamination of the protective layer from the underlying reactor component during fluidized bed reactor operation. In one embodiment, the intermediate coating is a nickel-chromium alloy.

In some embodiments, the protective layer has a minimum average thickness of 0.1 mm, and/or an average thickness from 0.1 mm to 1 mm, such as from 0.1 mm to 0.7 mm or from 0.25 mm to 0.5 mm. In certain embodiments, the thickness of the coating varies across the surface and/or along the length of a component. For example, if a portion of a probe, a nozzle, or a liner typically undergoes greater erosion during operation of the fluidized bed reactor, then a thicker protective layer can be applied to that portion of the probe, nozzle, or liner.

Figure 3:
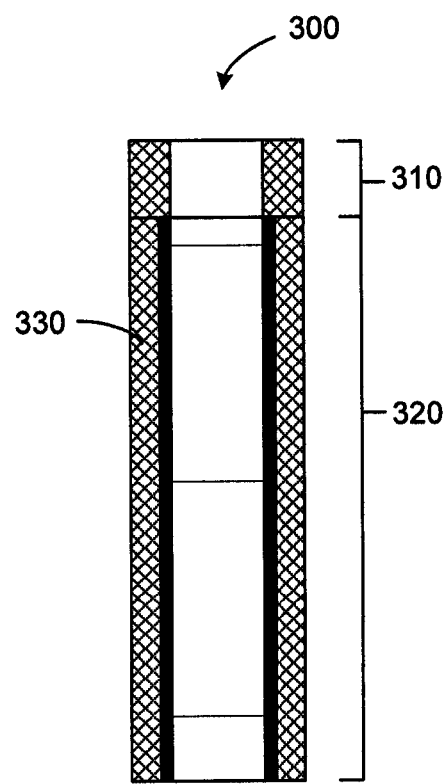
FIG. 3 is a schematic cross-sectional elevational view of an inlet tube including an upper portion composed of a protective layer material and a lower portion coated with the protective layer material.

In certain embodiments, a portion of a reactor component may have the same composition as the protective layer material. The remainder of the reactor component can be coated with the protective layer. For example, as shown in FIG. 3, an upper portion 310 of an inlet tube 300 (e.g., an upwardly facing injection nozzle or a fluidization gas inlet tube) can be composed of the protective layer material, and a lower portion 320 of the inlet tube is coated with the protective layer material 330.

Suitable protective layer materials include certain cobalt-based and nickel-based alloys and superalloys, silicon carbide, tungsten carbide (WC), silicon nitride, and combinations thereof. As used herein the term "superalloy" refers to a nickel- or cobalt-based alloy with a face-centered cubic (austenitic) structure. In certain embodiments, the suitable protective layer is a cobalt-based alloy or superalloy, a nickel-based alloy or superalloy, or any combination thereof.

Desirably, the protective layer does not release (e.g., through erosion or diffusion), under the operating conditions of the fluidized bed reactor, substantial amounts of metals that can contaminate the product particles. When producing silicon-coated particles, it is undesirable to have product contamination (e.g., at the parts per thousand level) by electron donors and/or electron acceptors, such as aluminum, arsenic, boron, or phosphorus. In some embodiments, the protective layer has a sufficient hardness and/or erosion resistance under the reactor operating conditions to minimize or prevent release of aluminum, arsenic, boron, or phosphorus from the protective layer. In certain embodiments, the protective layer material does not comprise aluminum, arsenic, boron, or phosphorus or, alternatively, does not comprise more than a trace amount of (e.g., ≤2% or ≤1%) aluminum, arsenic, boron, or phosphorus.

In some embodiments, the protective layer material is a cobalt-based alloy comprising 25-35% Cr, ≤10% W, ≤10% Ni, ≤5% Mo, ≤3% Fe, ≤2% Si, ≤2% C, ≤1.5% Mn, ≤1% B, ≤0.05% P, and ≤0.05% S, with the balance (30.5-75%) being cobalt. In some embodiments, the protective layer material is a nickel-based alloy having a composition comprising 4-30% Mo, 5-25% Cr, 2-15% Co, ≤2% Fe, ≤3.5% Ti, ≤2% Al, ≤1% Mn, ≤1% Si, ≤0.5% Cu, ≤0.1% C, ≤0.1% Zr, and ≤0.01% B, with the balance (23.4-89%) being nickel.

In one embodiment, the protective layer material is a cobalt alloy having a composition comprising 26-33% Cr, 7-9.5% W, ≤7% Ni, ≤2.5% Fe, ≤2% Si, 1.1-1.9% C, 0.5-1.5% Mn, 0.1-1.5% Mo, ≤1% B, ≤0.03% P, and ≤0.03% S, with the balance (~60%) being cobalt (e.g., Stellite® 12 alloy, available from Kennametal Stellite, Goshen, Ind.). In another embodiment, the protective layer material is a cobalt super-alloy having a composition comprising 26% Cr, 9% Ni, 5% Mo, 3% Fe, and 2% W, with the balance (~55%) being cobalt (e.g., Ultimet® alloy, available from Haynes International, Inc., Kokomo, Ind.).

In one embodiment, the protective layer material is a nickel-based superalloy having a composition comprising 20% Cr, 10% Co, 8.5% Mo, 2.1% Ti, 1.5% Al, ≤1.5% Fe, ≤0.3% Mn, ≤0.15% Si, ≤0.06% C, and ≤0.005% B, with the balance (~57%) being nickel (e.g., Haynes® 282® alloy available from Haynes International, Inc., Kokomo, IN). In another embodiment, the protective layer material is a nickel-based superalloy having a composition comprising 24-26% Mo, 7-9% Cr, 2.5% Co, ≤0.8% Mn, ≤0.8% Si, ≤0.5% Al, ≤0.5% Cu, ≤0.03% C, and ≤0.006% B, with the balance (~65%) being nickel (e.g., Haynes® 242® alloy, available from Haynes International, Inc., Kokomo, IN). In yet another embodiment, the protective layer material is a nickel-based superalloy having a composition comprising 18-21% Cr, 12-15% Co, 3.5-5% Mo, 2.75-3.25% Ti, 1.2-1.6% Al, 0.03-0.1% C, 0.02-0.08% Zr, 0.003-0.01% B, ≤2% Fe, ≤0.15% Si, ≤0.1% Cu, ≤0.1% Mn, ≤0.015% P, and ≤0.015% S, with the balance being nickel (e.g., Haynes® Waspaloy alloy, available from Haynes International, Inc., Kokomo, Ind.).

When used in a fluidized bed reactor for producing silicon-coated particles, embodiments of the disclosed protective layers reduce metal contamination in silicon-coated particles. In some embodiments, coating exposed metal surfaces with an embodiment of the disclosed protective layers reduces metal contamination in the silicon-coated particles by at least 70%, at least 80%, at least 90%, or at least 95% compared to silicon-coated particles produced in a reactor with uncoated exposed metal surfaces. In one example, coating a 304H stainless steel probe assembly with a cobalt-based superalloy reduced metal contamination by more than 90% compared to particles produced in a reactor including an uncoated 304H stainless steel probe assembly. Additionally, the coated probe assembly showed no wear after 50 days of use.

In some embodiments, the protective layer material is a powder, such as a powdered alloy or a mixture of non-alloyed powders provided in a ratio sufficient to form the desired alloy, and the powder is applied to a desired surface by any suitable method, including pouring, casting, dipping, spraying, or spinning followed by thermal fusion. The powder may be melted before application to the surface.

In other embodiments, the protective layer is applied by a thermal method, such as flame spraying (e.g., high-velocity flame spraying) or by plasma-transferred arc welding. When applying a protective layer using a thermal method, the protective layer material may be in the form of a powder alloy, a wire alloy, an electrode, or two or more materials of differing chemical composition (e.g., powders, wires, or electrodes) that are combined to form the desired alloy when applied to the surface.

EXAMPLE

A protective layer of Stellite® 12 alloy was applied by plasma transfer to a top probe assembly comprising a 304H stainless steel base. The protective layer had an average thickness of 0.020" (0.5 mm). Probes made of 304H may wear through in about 90 days of use in a fluidized bed reactor for production of silicon-coated granules. Other than the protective layer, the reactor materials contained no cobalt.

The coated assembly was placed in a fluidized bed reactor and run for approximately 50 days during two test runs. No wear was seen on the probe or protective layer. Analysis of the granular silicon product showed a steady-state level of cobalt during the first test run of ~1.5 ppbw (parts per billion by weight). The cobalt level dropped to ~0.5 ppbw during the second run. Cobalt analysis before the probe was used showed ~0.3 ppbw. Erosion of the bare 304H probe was estimated to contribute more than 25 ppbw total metals to the granular product contamination. In contrast, the Stellite® 12 protective layer provided minimal contamination.

On the second test run, tungsten was tracked and a steady state below the detection limit of 0.1 ppbw was observed. Chromium was detected at low single digits ppbw, but was believed to come from other exposed stainless steel surfaces within the reactor.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims.

We claim:

1. A method of reducing or eliminating contamination of silicon-coated particles due to contact with a surface in a fluidized bed reactor, the method comprising:
   providing, in a fluidized bed reactor, a fluidized bed reactor component having a surface facing silicon-coated particles during operation of the fluidized bed reactor, the surface comprising metal that is at least partially coated with a protective layer comprising a material having an ultimate tensile strength of at least 700 MPa at 650° C., wherein the protective layer is
      a cobalt-based alloy comprising 25-35% Cr, ≤10% W, ≤10% Ni, ≤5% Mo, ≤3% Fe, ≤2% Si, ≤2% C, ≤1.5% Mn, ≤1% B, ≤0.05% P, ≤0.05% S, and 30.5-75% cobalt, or
      a nickel-based alloy comprising 4-30% Mo, 5-25% Cr, 2-15% Co, ≤3.5% Ti, ≤2% Fe, ≤2% Al, ≤1% Mn, ≤1% Si, ≤0.5% Cu, ≤0.1% C, ≤0.1% Zr, ≤0.01% B, and 23.4-89% nickel; and
   operating the fluidized bed reactor to make silicon-coated particles.

2. The method of claim 1, wherein at least 95% of the surface is coated with the protective layer.

3. The method of claim 1, wherein the metal has a thermal coefficient of expansion, TCE-1, and the protective layer has a thermal coefficient of expansion, TCE-2, wherein TCE-2 and TCE-1 differ by ≤30%.

4. The method of claim 3, wherein an intermediate coating having a thermal coefficient of expansion, TCE-3, between TCE-1 and TCE-2 is disposed between the metal and the protective layer.

5. The method of claim 1, wherein the protective layer has a minimum average thickness of 0.1 mm.

6. The method of claim 5, wherein the protective layer has a thickness that varies across a width and/or along a length of the surface.

7. The method of claim 1, wherein a portion of the fluidized bed reactor component is constructed entirely of a material having substantially the same chemical composition as the protective layer.

8. The method of claim 7, wherein the fluidized bed reactor component is a fluidization gas inlet tube, an injection nozzle, a thermocouple, a pressure nozzle, or a sample nozzle.

9. The method of claim 1, wherein the fluidized bed reactor component is an injection nozzle, a fluidization gas inlet tube, a seed inlet tube, a product withdrawal outlet tube, a probe assembly, a sample nozzle, a pressure nozzle, a thermocouple, an internal heater, or a bubble breaker.

10. A fluidized bed reactor unit for production of polycrystalline silicon, the unit comprising:
    a reactor defining a reactor chamber; and
    one or more reactor components having a surface facing the reactor chamber, the surface comprising metal that is at least partially coated with a protective layer having an ultimate tensile strength of at least 700 MPa at 650° C., wherein the protective layer is
       a cobalt-based alloy comprising 25-35% Cr, ≤10% W, ≤10% Ni, ≤5% Mo, ≤3% Fe, ≤2% Si, ≤2% C, ≤1.5% Mn, ≤1% B, ≤0.05% P, ≤0.05% S, and 30.5-75% cobalt, or
       a nickel-based alloy comprising 4-30% Mo, 5-25% Cr, 2-15% Co, ≤3.5% Ti, ≤2% Fe, ≤2% Al, ≤1% Mn, ≤1% Si, ≤0.5% Cu, ≤0.1% C, ≤0.1% Zr, ≤0.01% B, and 23.4-89% nickel.

11. The fluidized bed reactor unit of claim 10, wherein the metal has a first thermal coefficient of expansion (TCE-1) and the protective layer has a second thermal coefficient of expansion (TCE-2) that differs from TCE-1 by ≤30%.

12. The fluidized bed reactor unit of claim 10, wherein the reactor component further comprises an intermediate coating having a thermal coefficient of expansion, TCE-3, between TCE-1 and TCE-2, wherein the intermediate layer is positioned between the metal and the protective layer.

13. The fluidized bed reactor unit of claim 10, wherein the protective layer has an average thickness from 0.1 mm to 1 mm.

14. The fluidized bed reactor unit of claim 13, wherein the protective layer has a thickness that varies across a width and/or along a length of the surface.

15. The fluidized bed reactor unit of claim 10, wherein the protective layer comprises a cobalt-based alloy, a nickel-based alloy, or a combination thereof.

16. The fluidized bed reactor unit of claim 10, wherein a portion of reactor component is constructed entirely of a material having substantially the same chemical composition as the protective layer.

17. A process for the production of granulate polycrystalline silicon particles, the process comprising flowing a silicon-containing gas through a fluidized bed reactor containing a seed particle within a reactor chamber defined by the fluidized bed reactor to effect pyrolysis of the silicon-containing gas and deposition of a polycrystalline silicon layer on the seed particle to form a polycrystalline silicon-coated particle, wherein the fluidized bed reactor comprises one or more reactor components having a surface facing the reactor chamber during reactor operation, the surface comprising metal that is at least partially coated with a protective layer having an ultimate tensile strength of at least 700 MPa at 650° C., wherein the protective layer is a cobalt-based alloy comprising 25-35% Cr, ≤10% W, ≤10% Ni, ≤5% Mo, ≤3% Fe, ≤2% Si, ≤2% C, ≤1.5% Mn, ≤1% B, ≤0.05% P, ≤0.05% S, and 30.5-75% cobalt, or a nickel-based alloy comprising 4-30% Mo, 5-25% Cr, 2-15% Co, ≤3.5% Ti, ≤2% Fe, ≤2% Al, ≤1% Mn, ≤1% Si, ≤0.5% Cu, ≤0.1% C, ≤0.1% Zr, ≤0.01% B, and 23.4-89% nickel.

18. The process of claim 17, wherein at least 95% of the surface is coated with the protective layer, thereby reducing or eliminating contact of the polycrystalline silicon-coated particle with the metal and reducing or eliminating metal contamination of the polycrystalline silicon particle.

\* \* \* \* \*